United States Patent
Ainspan et al.

(10) Patent No.: US 8,928,418 B2
(45) Date of Patent: Jan. 6, 2015

(54) COMPENSATING FOR PROCESS VARIATION IN INTEGRATED CIRCUIT FABRICATION

(71) Applicant: International Business Machines Corporation, Armonk, NY (US)

(72) Inventors: Herschel A. Ainspan, New Hempstead, NY (US); Anthony R. Bonaccio, Shelburne, VT (US); Ramana M. Malladi, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 13/766,304

(22) Filed: Feb. 13, 2013

(65) Prior Publication Data

US 2014/0225665 A1    Aug. 14, 2014

(51) Int. Cl.
  *H03B 5/08*   (2006.01)
  *G05F 3/02*   (2006.01)

(52) U.S. Cl.
  CPC ........................................ *G05F 3/02* (2013.01)
  USPC ......... 331/36 C; 331/44; 331/167; 331/177 V

(58) Field of Classification Search
  USPC .......... 331/34, 36 C, 44, 117 FE, 117 R, 167, 331/177 R, 177 V
  See application file for complete search history.

(56) References Cited

U.S. PATENT DOCUMENTS

| | | | |
|---|---|---|---|
| 3,970,875 A | 7/1976 | Leehan | |
| 5,311,149 A * | 5/1994 | Wagner et al. | 331/1 A |
| 5,331,295 A | 7/1994 | Jelinek et al. | |
| 5,760,657 A | 6/1998 | Johnson | |
| 5,892,409 A | 4/1999 | Boerstler | |
| 5,903,012 A | 5/1999 | Boerstler | |
| 6,211,745 B1 * | 4/2001 | Mucke et al. | 331/117 R |
| 6,268,778 B1 | 7/2001 | Mucke et al. | |
| 6,323,736 B2 | 11/2001 | Jansson | |
| 6,621,365 B1 * | 9/2003 | Hallivuori et al. | 331/179 |
| 6,778,022 B1 | 8/2004 | Zhang et al. | |
| 7,046,098 B2 * | 5/2006 | Staszewski | 331/158 |
| 7,227,423 B2 * | 6/2007 | McCorquodale et al. | 331/179 |
| 7,280,002 B2 | 10/2007 | Loke et al. | |
| 7,292,115 B2 | 11/2007 | Soltanian et al. | |
| 7,343,146 B2 * | 3/2008 | Hallivuori et al. | 455/333 |
| 7,355,482 B2 | 4/2008 | Meltzer | |

(Continued)

OTHER PUBLICATIONS

Boughanmi et al., "Optimum VCO's for Radiofrequency Applications", Electronic Components and Technology Conference, IEEE, 2006, pp. 1761-1764.

(Continued)

*Primary Examiner* — Levi Gannon
(74) *Attorney, Agent, or Firm* — David Cain; Roberts Mlotkowski Safran & Cole, P.C.

(57) ABSTRACT

Systems and methods for reducing process sensitivity in integrated circuit ("IC") fabrication. An integrated circuit structure is provided that includes a first integrated circuit device having at least one parameter influenced by process variation in a first manner. The integrated circuit structure further includes a second integrated device having the least one parameter influenced by the process variation in a second manner. The first manner is opposite of the second manner. The second integrated device is configured to offset or reduce the influence of the process variation on the at least one parameter in the first integrated circuit device.

14 Claims, 12 Drawing Sheets

(56) References Cited

U.S. PATENT DOCUMENTS

| | | |
|---|---|---|
| 7,385,453 B2 * | 6/2008 | Nervegna ............... 331/176 |
| 7,446,592 B2 | 11/2008 | Tripathi et al. |
| 7,463,101 B2 | 12/2008 | Tung |
| 7,626,470 B2 | 12/2009 | Yu |
| 7,675,378 B2 | 3/2010 | Feng et al. |
| 7,679,461 B2 * | 3/2010 | Gevorgyan et al. .......... 331/66 |
| 7,728,686 B2 * | 6/2010 | Zhan et al. ............... 331/179 |
| 7,936,223 B2 | 5/2011 | Little et al. |
| 8,089,326 B2 | 1/2012 | Weng |
| 8,134,418 B2 * | 3/2012 | Jiang .................. 331/177 V |
| 8,274,339 B2 * | 9/2012 | Fan et al. ............... 331/176 |
| 8,421,556 B2 * | 4/2013 | Chen et al. ............... 333/174 |
| 2006/0139105 A1 | 6/2006 | Maxim et al. |
| 2007/0247237 A1 | 10/2007 | Mohammadi |
| 2013/0093524 A1 * | 4/2013 | Nakamura ............... 331/34 |

OTHER PUBLICATIONS

Jun et al., "An Improved Low Phase Noise and Low Power Consumption VCO for WSN Applications", Wireless Communications and Signal Processing (WCSP), International Conference on Digital Object, IEEE, 2010, 5 pages.

* cited by examiner

|  |  | Second Device 70 | | First Device 45 | |
|---|---|---|---|---|---|
|  |  | Cov | Cdepl | Cov | Cdepl |
| Process Knob | Direction of Process Knob | | | | |
| Bulk Doping/Threshold Adj. Implant | ↓ | ↑ | ↓ | ↓ | ↓ |
| Oxide Thickness | ↓ | ↑ | ↓ | ↓ | ↓ |
| Effective Length of Channel | ↓ | --- | ↓ | ↓ | ↓ |

FIG. 12

Δ=750 MHz

Δ=690 MHz

COMPENSATING FOR PROCESS VARIATION IN INTEGRATED CIRCUIT FABRICATION

FIELD OF THE INVENTION

The invention relates to systems and methods for reducing process sensitivity in integrated circuit ("IC") fabrication and, more particularly, to systems and methods for compensating for process variation in the fabrication of voltage controlled oscillators (VCOs).

BACKGROUND

A VCO is an electronic oscillator designed to be controlled in oscillation frequency by a voltage input. The frequency of oscillation is varied by applied direct current (DC) voltage, while modulating signals may also be fed into the VCO to cause frequency modulation (FM) or phase modulation (PM). VCOs are used in virtually all Spread Spectrum, radio frequency (RF), and wireless systems.

However, IC fabrication process variation is a factor that may limit the designable frequency-range of VCOs. For example, in advanced complimentary metal-oxide-semiconductor (CMOS) technologies, wide variation in CMOS fabricating processes (e.g., lithographic processes) that influence the features of the CMOS structures (e.g., lengths, widths, oxide thicknesses, etc.) necessitates innovative circuit designs to counteract the process variation.

Accordingly, there exists a need in the art to overcome the deficiencies and limitations described hereinabove.

SUMMARY

In a first aspect of the invention, an integrated circuit structure is provided that includes a first integrated circuit device having at least one parameter influenced by process variation in a first manner. The integrated circuit structure further including a second integrated device having the least one parameter influenced by the process variation in a second manner. The first manner is opposite of the second manner. The second integrated device is configured to offset or reduce the influence of the process variation on the at least one parameter in the first integrated circuit device In another aspect of the invention, an integrated circuit structure is provided for reducing dependence of a VCO. The integrated circuit structure includes an inverse tracking pair of devices configured to perform as capacitors in the VCO.

In yet another aspect of the invention, a method is provided for reducing process sensitivity of at least one parameter in a semiconductor product. The method includes analyzing an effect of process variation on the at least one parameter for a first integrated circuit design at a first process corner. The method further includes analyzing an effect of the process variation on the at least one parameter for a second integrated circuit design at the first process corner. The method further includes comparing the affect effect of the process variation on the at least one parameter for the first integrated circuit design to the effect of the process variation on the at least one parameter for the second integrated circuit design. The method further includes determining whether the effect of the process variation on the at least one parameter for the first integrated circuit design tracks opposite to the effect of the process variation on the at least one parameter for the second integrated circuit design. The method further includes identifying the first integrated circuit design and the second integrated circuit design as an inverse tracking pair of devices when the effect of the process variation on the at least one parameter for the first integrated circuit design tracks opposite to the effect of the process variation on the at least one parameter for the second integrated circuit design

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

FIG. 12 is a table illustrating opposite tracking of process variation between a pair of devices.

DETAILED DESCRIPTION

The invention relates to systems and methods for reducing process sensitivity in IC fabrication and, more particularly, to systems and methods for compensating for process variation in the fabrication of VCOs. More specifically, implementations of the invention provide systems and methods for offsetting or reducing process variation in IC designs, such as for VCOs, through the implementation of inverse tracking devices. Advantageously, the performance of the systems and methods discussed herein provide an inverse tracking system that is configured to counteract the process variation observed in standard IC designs.

Hereafter embodiments of the present invention are discussed with respect to VCO circuits and an exemplary pair of devices that are configured to track inversely to one another such that the devices offset or compensate for process dependency from one another in the VCO circuit. However, it should be understood by one skilled in the art that aspects of the present invention may be implemented using any number or type of devices that track inversely to one another such that the devices offset or compensate for process dependency from one another in practically any type of IC design.

Figure 1:
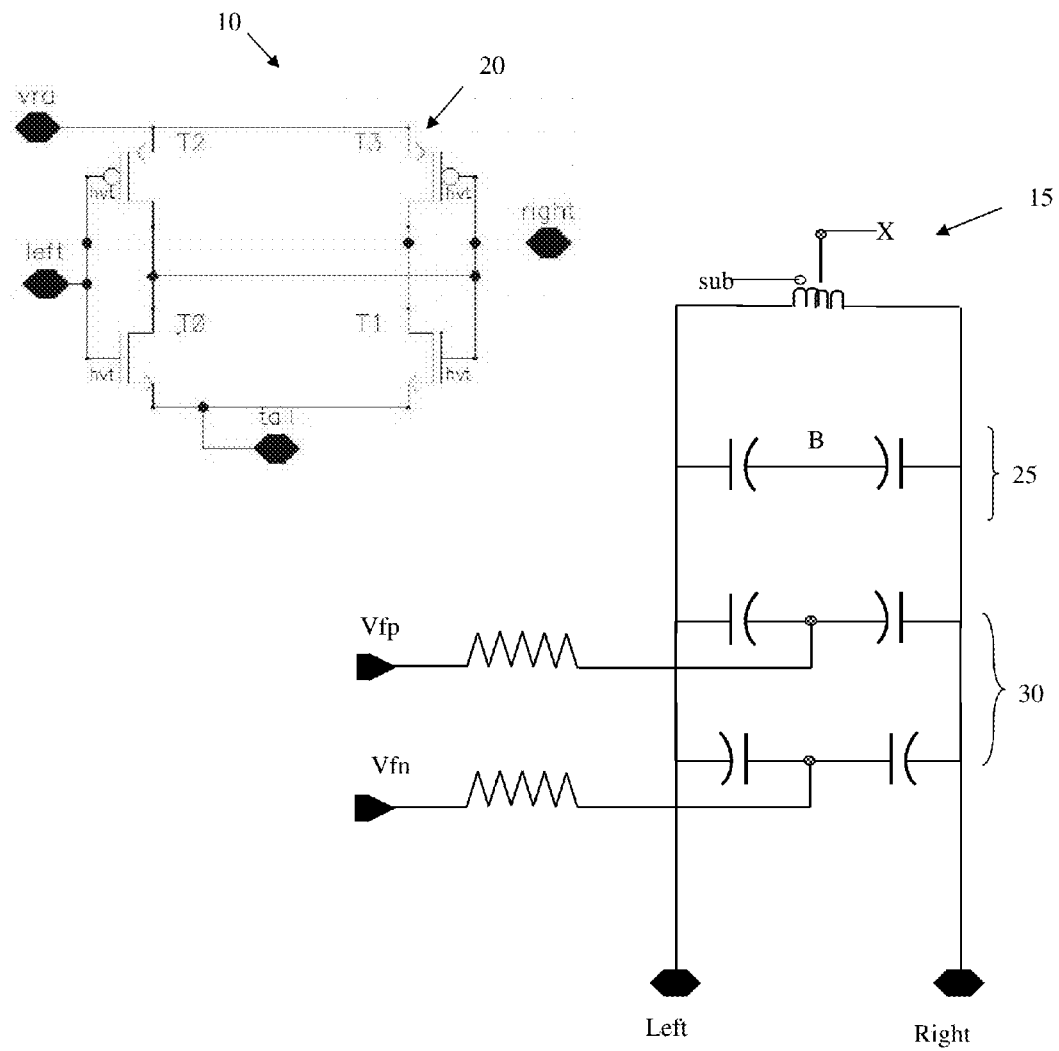
FIG. 1 is an electrical schematic of a VCO.

As discussed above, IC fabrication process variation is a large factor that limits the designable frequency-range of VCOs. For example, FIG. 1 shows a topology of a cross-coupled VCO 10 comprising a resonator (LC tank or circuit) 15 and a transconductance amplifier (gmcell) 20 operating at 8 GHz. The one or more branch 25 (e.g., fixed branch(s))

provides a fixed capacitance. For example in one implementation, the capacitance can take two values as controlled by tune bit 'bx'. The two branches 30 (e.g., Cfinetune branches) of the capacitor network may be adjusted or fine tuned by a control voltage (Vcont), and in a phase locked loop (PLL) configuration the adjustment may be obtained from a low-pass filter.

Figure 2:
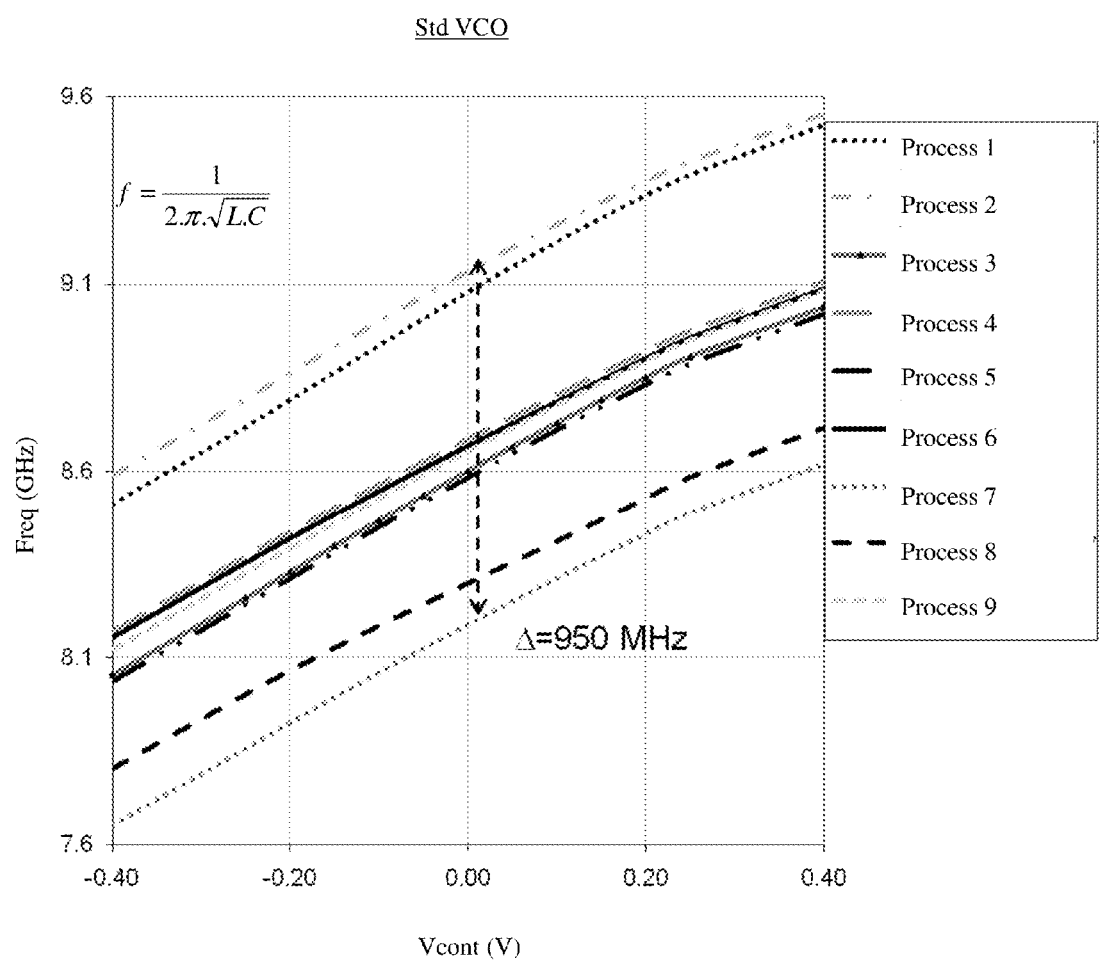
FIG. 2 is a graph illustrating process variation for the VCO of FIG. 1.

FIG. 2 shows the process variation of the frequency of oscillation of the cross-coupled VCO 10 (as described with respect to FIG. 1) as a function of filter voltage. Specifically, it can be seen that, for Vcont=0, the frequency varies by 950 MHz. This means to design for a target frequency of 8 GHz, process variation alone forces the VCO design to have a margin from 7.5 GHz to 8.5 GHz. If there is a spec on frequency range, for example of +/−10%, the process variation will force the VCO design to have a frequency range of +/−20%. However, sometimes, such a wide tuning range is unattainable in a given process.

In one example, the process variation illustrated in FIG. 2 can be decomposed and equated roughly into the following parts: Transconductance amplifier (gmcell)=20%, Capacitor bank=78%, and Inductor=2%. Therefore, most of the variation is coming from capacitors in the resonator (LC tank or circuit), also called a resonant circuit, tank circuit, or tuned circuit, which comprises at least one inductor, represented by the letter L, and at least one capacitor, represented by the letter C. When connected together, the inductor and capacitor may act as an electrical resonator, which is an electrical analogue of a tuning fork, storing energy oscillating at the circuit's resonant frequency.

The total capacitance of the capacitor bank may be expressed as Equation (1):

$$C\text{total}=C\text{fixed}+C\text{finetune}=bx\ldots C\text{low}+(1-bx)\cdot C\text{high}+C\text{finetune} \quad (1)$$

The first term (Cfixed) is the fixed capacitance. When a varactor is used for fixed capacitors, bx can be varied in voltage to obtain different capacitances. Specifically, Clow is the capacitance with tune bit 'bx' set to 1 and Chigh is the capacitance with 'bx' set to 0. A is a lumped constant, e.g., the area of the capacitor. The second term (Cfinetune) is the adjusted/voltage-tunable capacitance. Therefore, from Equation (1), it can be seen that the process dependency of capacitance for the VCO may be nullified or reduced (i) if the process variation of the fixed capacitors (Cfixed) tracks opposite to the process variation of the finetune capacitors (Cfinetune), or (ii) if the process variation of capacitors in the low state (Clow) tracks opposite to the process variation of capacitors in the high state (CHigh).

Accordingly, in embodiments of the present invention, in order to nullify or reduce the process dependency of capacitance, an inverse tracking system may be established and implemented within the VCO. For example and as discussed in detail below, an inverse tracking system may be established that comprises at least two devices that offset or compensate for process dependency from one another. In embodiments, the first device (e.g., a fixed capacitor with a first design structure) may be implemented in one branch of the VCO and the second device (e.g., a fixed capacitor with a second design structure) may be implemented in another branch of the VCO such that the process variation of one branch is compensated by the other added branch.

In alternative or additional embodiments, the first device (e.g., a fixed capacitor with a first design structure) may be implemented in one branch of the VCO (e.g., a first branch) and the second device (e.g., a fixed capacitor with a second design structure) may be implemented in another branch of the VCO (e.g., a second branch) such that pairs of branches of the VCO compensate for one another. In alternative or additional embodiments, the first device (e.g., a fixed capacitor with a first design structure) may be implemented for a first set of branches of the VCO (e.g., all Cfixed branches) and the second device (e.g., a finetune capacitor with a second design structure) may be implemented for another set of branches of the VCO (e.g., all Cfinetune branches) such that Cfixed compensates for Cfinetune. In alternative or additional embodiments, the first device (e.g., a fixed capacitor with a first design structure) may be implemented for a first set of branches of the VCO (e.g., all Cfixed branches), the second device (e.g., a finetune capacitor with a second design structure) may be implemented for another set of branches of the VCO (e.g., all Cfinetune branches), and an additional first device (e.g., a fixed capacitor with a third design structure) may be implemented as an individual branch that always tracks opposite to the set of branches comprising the second device such that Cfixed compensates for Cfinetune.

Figure 3:
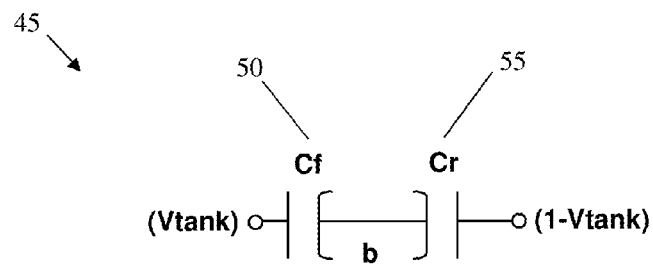
FIG. 3 is an electrical schematic of a device in accordance with aspects of the invention.

As shown in FIG. 3, in embodiments, the first device 45 may comprise two capacitors 50 (Cf and Cr) and 55 connected in series and controlled (b) to take a high state (0) and a low state (1). The first capacitor 50 may be electrically connected to a left node (Vtank) of an LC tank of a VCO and the second capacitor 55 may be electrically connected to a right node (1-Vtank) of the LC tank of the VCO.

Figure 4:
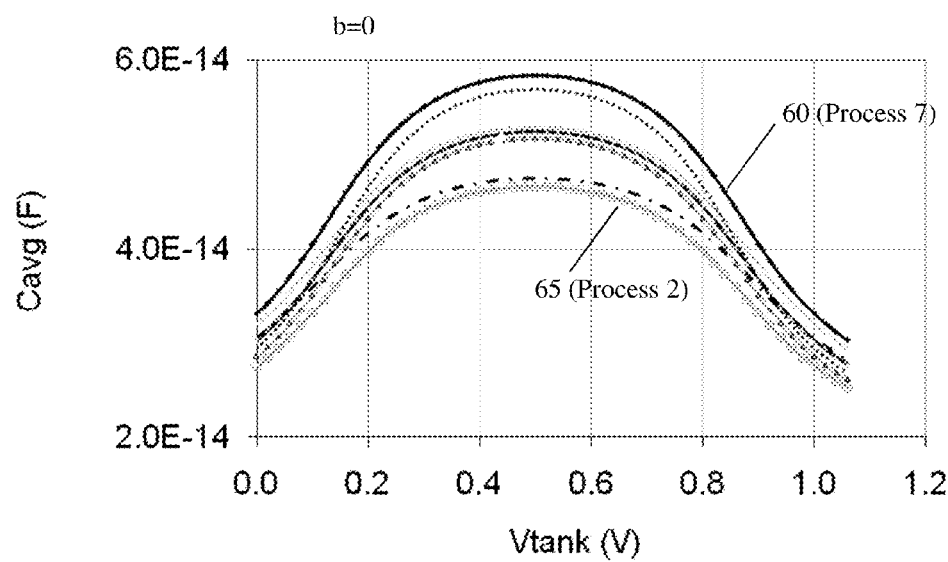
FIGS. 4 and 5 are graphs illustrating process variation in accordance with aspects of the invention.
Figure 5:
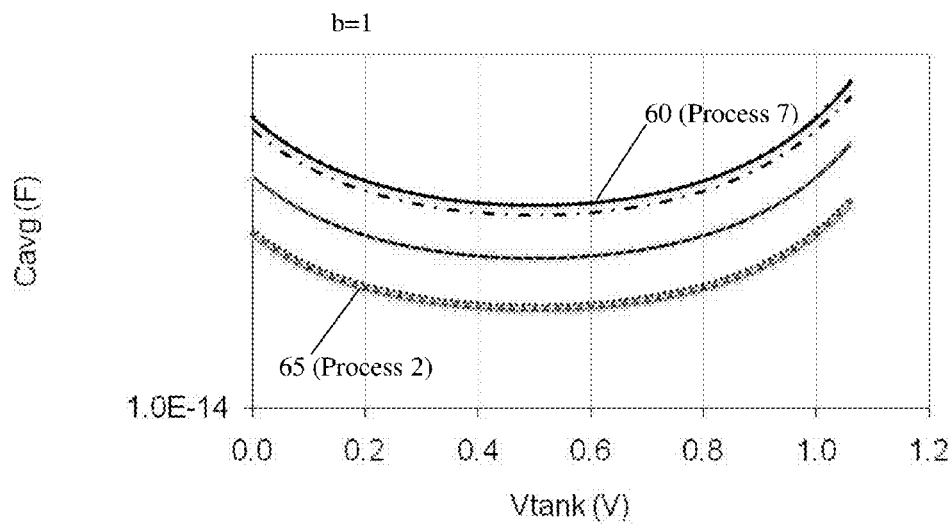

As can be seen in FIG. 4, when the first device 45 is placed in the high state (b=0) a first process corner 60 of the first device generates a maximum capacitance and a second process corner 65 generates a minimum capacitance. As can be seen in FIG. 5, when the first device 45 is placed in the low state (b=1), the first process corner 60 of the first device still generates a maximum capacitance and the second process corner 65 still generates a minimum capacitance. Thus, the process dependency for the first device 45 may be interpreted to track in the same direction for both states of control (b).

Figure 6:
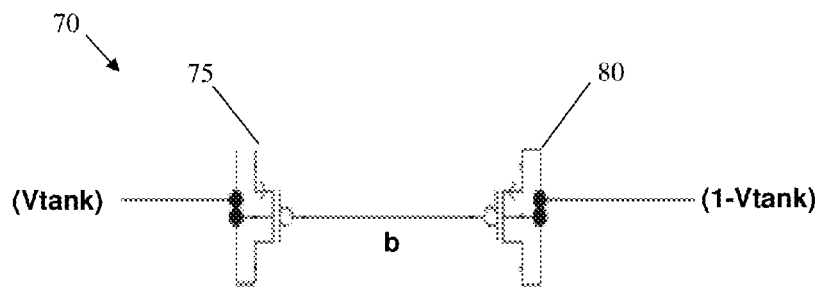
FIG. 6 is an electrical schematic of a device in accordance with aspects of the invention.

As shown in FIG. 6, in embodiments, the second device 70 may comprise a pFET 75 and another pFET 80 connected in series, and control (b) to take a high state (0) and a low state (1). The pFET 75 may be electrically connected to a left node (Vtank) of an LC tank of a VCO and the pFET 80 may be electrically connected to a right node (1-Vtank) of the LC tank of the VCO.

Figure 7:
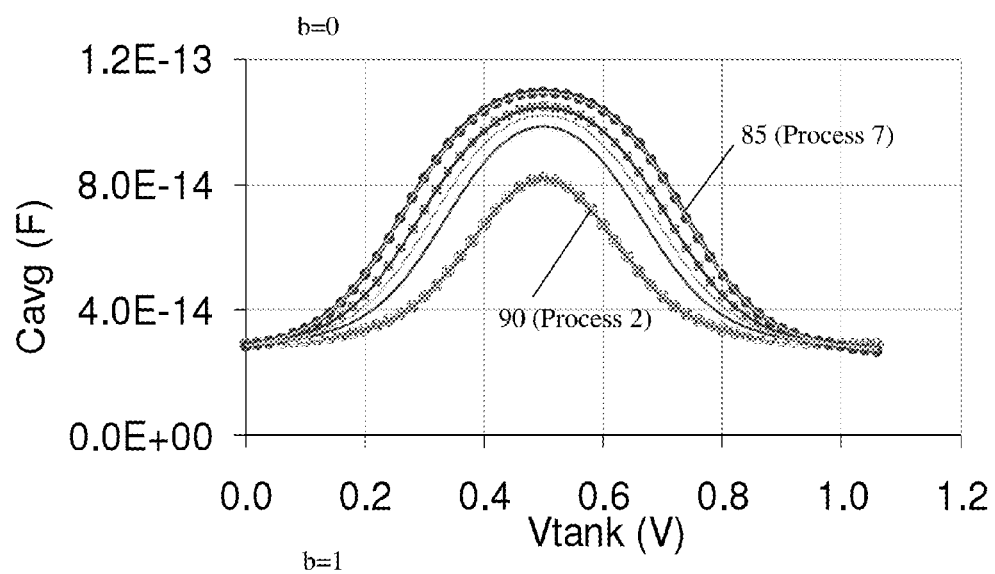
FIGS. 7, 8, and 9 are graphs illustrating process variation in accordance with aspects of the invention.
Figure 8:
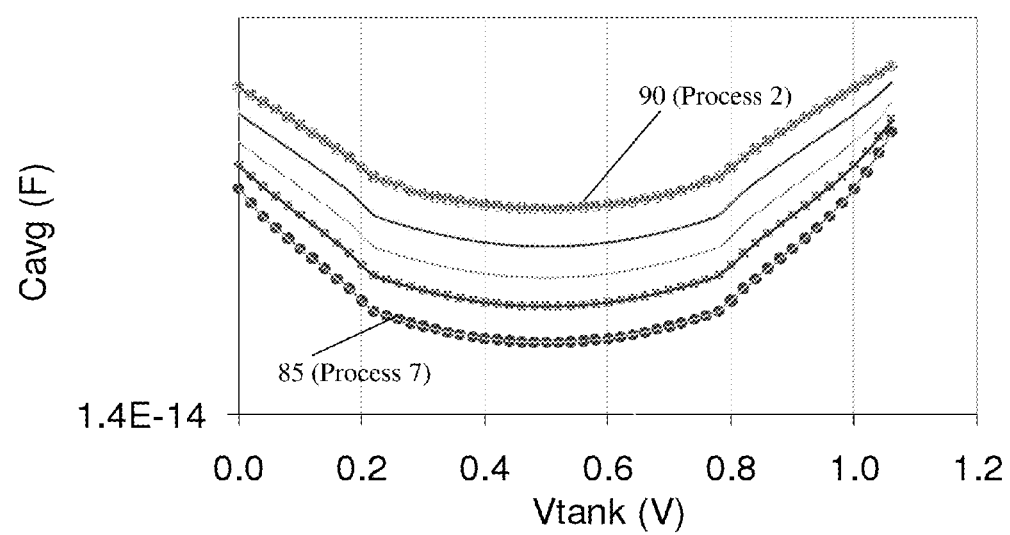

As can be seen in FIG. 7, when the second device 70 is placed in the high state (b=0) a first process corner 85 of the first device generates a maximum capacitance and a second process corner 90 generates a minimum capacitance. However, in contrast, as can be seen in FIG. 8, when the first device 85 is placed in the low state (b=1) the first process corner 85 of the first device generates a minimum capacitance and the second process corner 90 generates a maximum capacitance. Thus, the process dependency for the second device 70 may be interpreted to track in opposite directions (inversely) between the two states of control (b).

Figure 9:
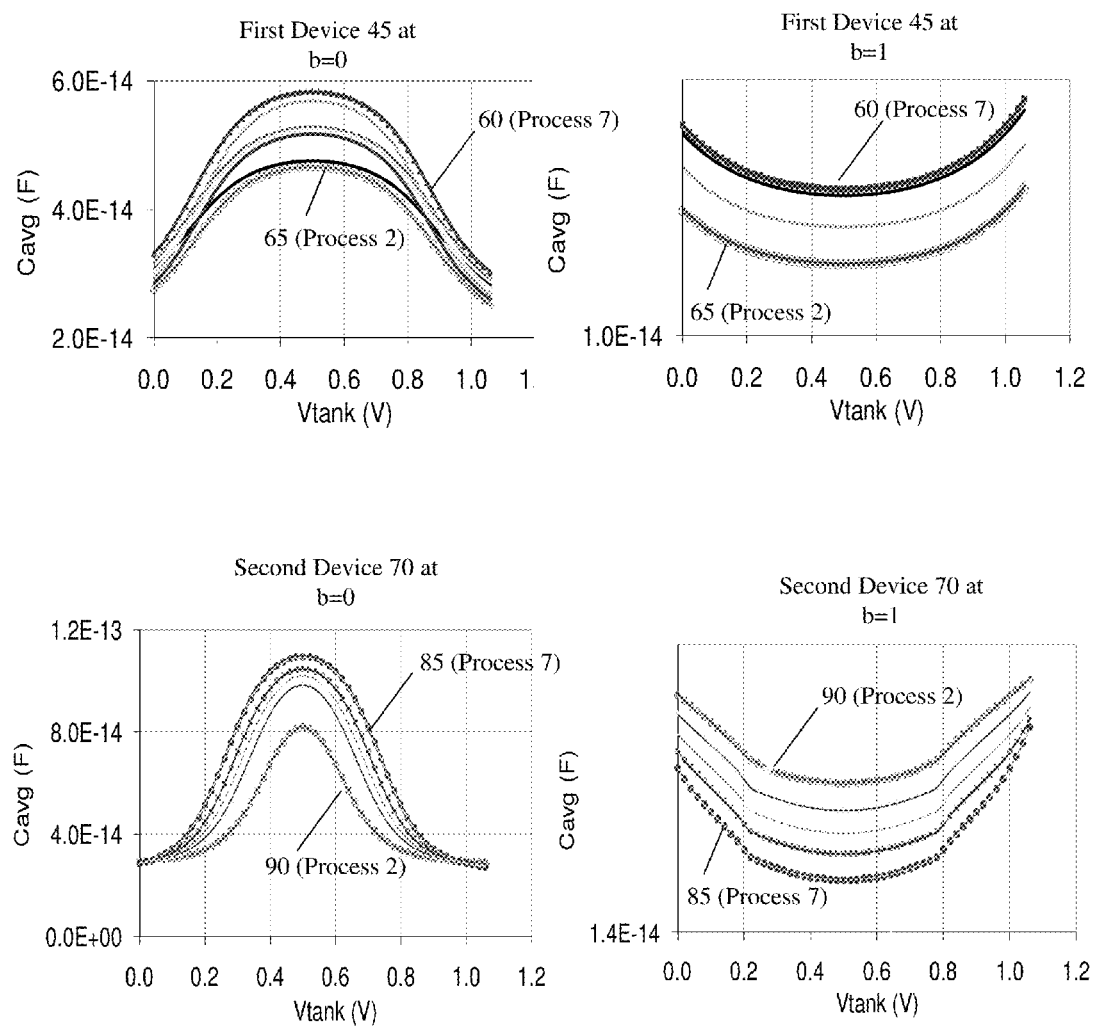

The variation of capacitance with LC tank voltage for the first device 45 and the second device 70 (as discussed above with respect to FIGS. 3 and 6) are contrasted in FIG. 9. As shown, the capacitances are obtained from s-parameter simulations. For b=1 state, the capacitance of the first device 45 and the second device 70 track inversely, i.e., the first process corner 60, 85 shows maximum capacitance for the first device 45, but shows a minimum capacitance for the second device 70. Therefore, for the b=1 state (e.g., low state), these two devices form a good "inverse tracking pair", canceling the process variation of each other.

As for the b=0 state (e.g., high state), these two devices track in the same direction. If there are multiple branches, all states of the branches except for one can still be benefited by inverse tracking pair. If there are multiple branches of Cfixed, it may be advantageous to pair the inverse tracking devices in each branch of the Cfixed capacitors to reduce or compensate for some process variation.

Figure 10:
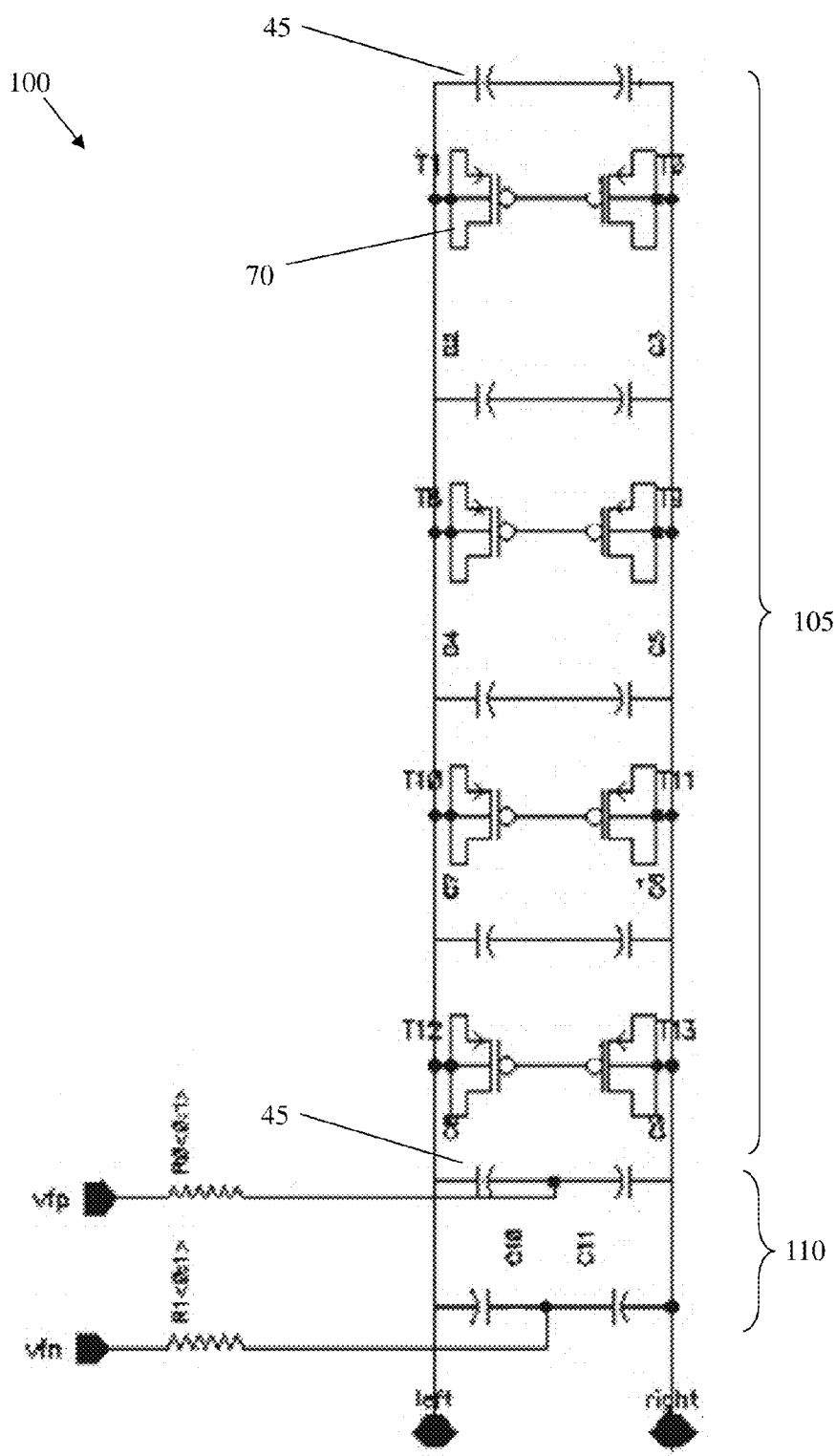
FIG. 10 is an electrical schematic of a VCO in accordance with aspects of the invention.

For example, FIG. 10 shows an implementation of the inverse tracking system comprising the first device 45 and the second device 70 in a VCO 100. As shown in FIG. 10, each of the branches 105 (e.g., the four Cfixed branches) of the capacitor network comprises at least one first device 45 and at least one second device 70 configured to be set to a 0 or 1 state (e.g., high or low). Each of the branches 110 (e.g., the two Cfinetune branches) of the capacitor network comprises at least one first device 45. The capacitance for each branch is determined for a given inductance and frequency of oscillation using the formula $f=1/(2\cdot\pi\cdot(LC)^{1/2})$.

Accordingly, the capacitance for each of the Cfixed branches is divided equally between the at least one first device 45 and the at least one second device 70 such that the devices reduce or compensate for at least some process variation between themselves. Specifically, in the arrangement shown in FIG. 10, the two devices compensate for Clow and Chigh process variation. However, it should be understood by those of ordinary skill in the art that other ratios are possible to obtain variations on the amount of process variation reduced or compensated for between the devices.

Figure 11:
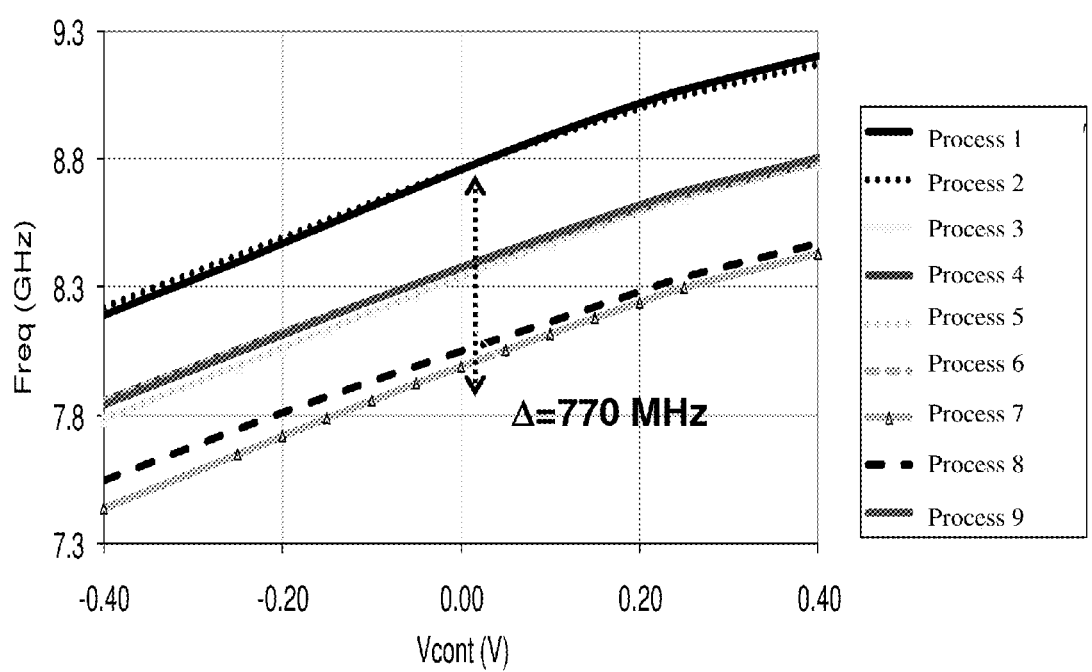
FIG. 11 is a graph illustrating process variation in accordance with aspects of the invention.

FIG. 11 shows the process dependence of frequency vs. control voltage (Vcont) for the VCO design shown in FIG. 10. It can be seen that a process variation of 770 MHz has decreased by about 19% from the process variation of 950 MHz determined for the VCO design shown in FIG. 1. Therefore, it is evident that the inverse tracking device system in accordance with aspects of the invention, as shown in FIG. 10, can be utilized in IC designs to offset or compensate for fabrication process variation.

FIG. 12 provides process data that explains why the process variation tracks opposite between devices 45 and 70. Specifically, as shown in FIG. 12, as the direction of the process knob (e.g., process corner) decreases for bulk doping, the overlap capacitance for the second device 70 increases while the depletion capacitance decreases, and the overlap capacitance for the first device 45 decreases while the depletion capacitance decreases. As the direction of the process knob (e.g., process corner) decreases for oxide thickness the overlap capacitance for the second device 70 increases while the depletion capacitance decreases, and the overlap capacitance for the first device 45 decreases while the depletion capacitance decreases. As the direction of the process knob (e.g., process corner) decreases for effective channel length the overall capacitance for the second device 70 is not effected while the depletion capacitance decreases, and the overlap capacitance for the first device 45 decreases while the depletion capacitance decreases. Therefore, one can take advantage of this inverse behavior between the first device 45 and the second device 70 by using the devices in pair to reduce/cancel the process dependence of the overall system.

Figures 13A, 13B, 13C:
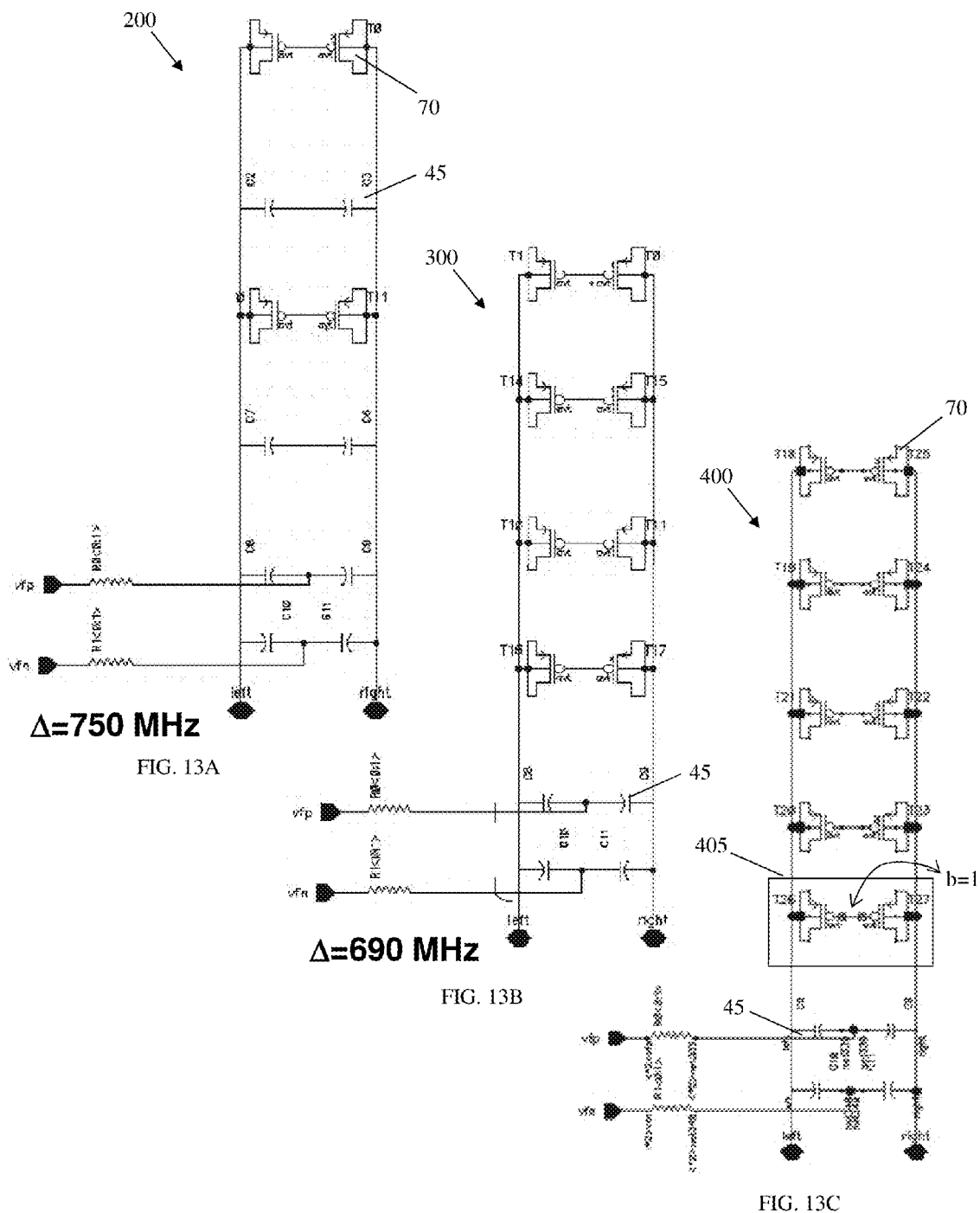
FIGS. 13A-C show multiple electrical schematics of VCOs in accordance with aspects of the invention.

FIGS. 13A-C show additional or alternative embodiments comprising the first device 45 and the second device 70 in a VCO circuit design and corresponding improvements. For example, in the VCO 200 shown in FIG. 13A, the first device 45 may be implemented in one branch of the VCO (e.g., a first branch) and the second device may 70 be implemented in another branch of the VCO (e.g., a second branch) such that pairs of branches (e.g., the Cfixed branches) of the VCO 200 compensate for each other's process variation. The process variation of 750 MHz of the VCO 200, has decreased by about 20% from the process variation of 950 MHz determined for the VCO design shown in FIG. 1.

In VCO 300 shown in FIG. 13B, the second device 70 may be implemented for a first set of branches of the VCO (e.g., all Cfixed branches) and the first device 45 may be implemented for another set of branches of the VCO (e.g., all Cfinetune branches) such that the Cfixed branches compensate for the Cfinetune branches. The process variation of 690 MHz of the VCO 300 has decreased by about 27% from the process variation of 950 MHz determined for the VCO design shown in FIG. 1.

In VCO 400 shown in FIG. 13C, the second device 70 may be implemented for a first set of branches of the VCO (e.g., all Cfixed branches), the second device 45 may be implemented for another set of branches of the VCO (e.g., all Cfinetune branches), and an additional first device 405 may be implemented as an individual branch that always tracks opposite to the set of branches comprising the first device 34 such that Cfixed compensates for Cfinetune. For this additional branch 405, the tune bit (b) may be set to '1' or whatever value that results in inverse tracking, since for this setting the variation is in inverse proportion, in accordance with for example FIG. 9.

As discussed above, it should be understood by one skilled in the art that aspects of the present invention may be implemented using any number or type of devices in various arrangements that track inversely to one another such that the devices offset or compensate for process dependency from one another in the IC. In particular, the concept of offsetting process dependence using at least an inverse tracking pair of devices may be generally applied to any IC design fabrication that demonstrates the effects of process variation. For example, a low-pass RC filter used in PLLs may employ two capacitors connected in a differential fashion. These capacitors can be formed using a well-designed inverse tracking pair. Furthermore, a FET with opposite process dependence developed in standard process can have wide-ranging applications.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 14:
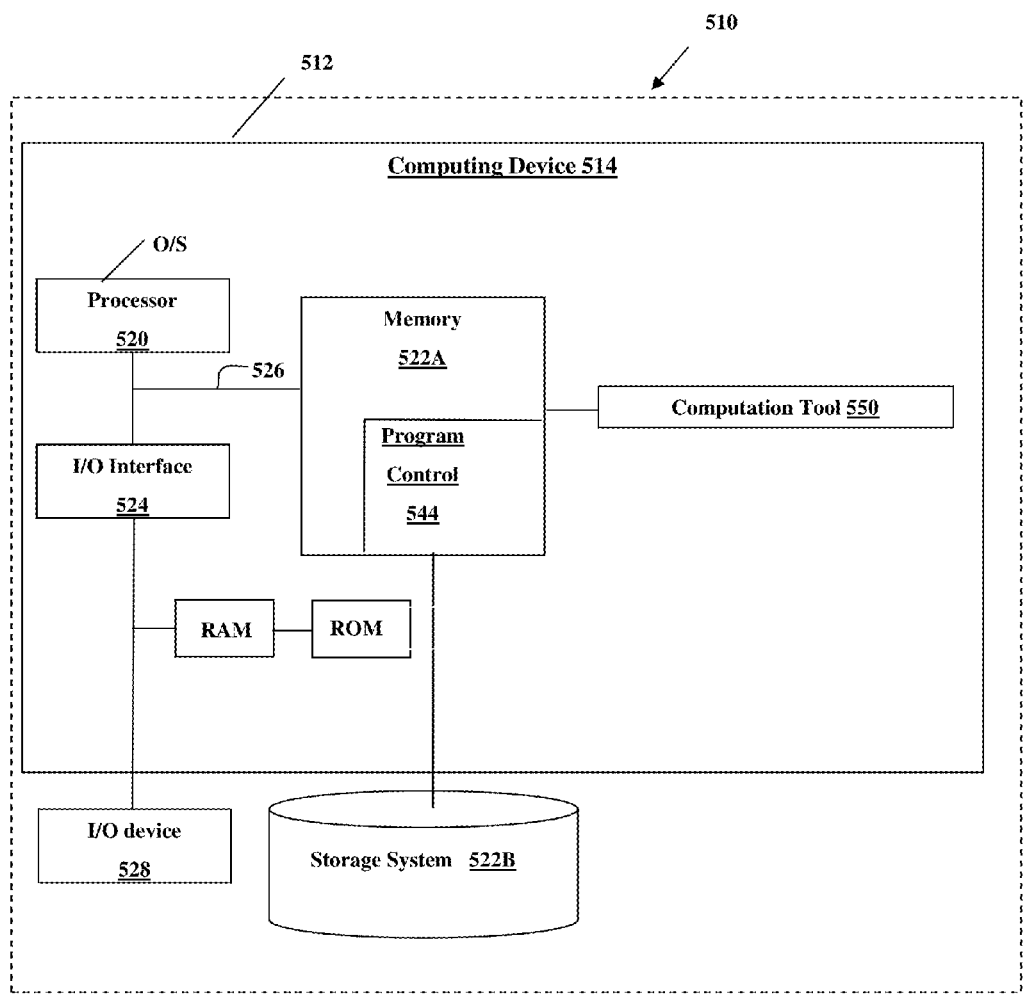
FIG. 14 is an illustrative external environment for implementing the invention in accordance with aspects of the invention.

FIG. 14 shows an illustrative environment 510 for managing the processes in accordance with the invention. To this extent, the environment 510 includes a server or other computing system 512 that can perform the processes described herein. In particular, the server 512 includes a computing device 514. The computing device 514 can be resident on a network infrastructure or computing device of a third party service provider (any of which is generally represented in FIG. 14).

The computing device 514 also includes a processor 520, memory 522A, an I/O interface 524, and a bus 526. The memory 522A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 514 is in communication with the external I/O device/resource 528 and the storage system 522B. For example, the I/O device 528 can comprise any device that enables an individual to interact with the computing device 514 (e.g., user interface) or any device that enables the computing device 514 to communicate with one or more other computing devices using any type of communications link. The external I/O device/resource 528 may be for example, a handheld device, PDA, handset, keyboard etc.

In general, the processor 520 executes computer program code (e.g., program control 544), which can be stored in the memory 522A and/or storage system 522B. Moreover, in accordance with aspects of the invention, the program control 544 controls a computation tool 550, e.g., at least a portion of an electronic design automation (EDA) application or tool, which performs the processes described herein. The computation tool 550 can be implemented as one or more program code in the program control 544 stored in memory 522A as separate or combined modules. Additionally, the computation tool 550 may be implemented as separate dedicated processors or a single or several processors to provide the function of these tools.

In embodiments, the computation tool 550 may be configured to load design and timing models for a number of IC designs. In additional embodiments, the computation tool 550 may be further configured to analyze an effect of process variation on at least one parameter for each of the loaded design structures at multiple process corners, compare the effects of the process variation on the at least one parameter at the multiple process corners for each design structure with the other design structures, and identify at least two design structures that demonstrate at least some process variation inverse tracking to one another, as further discussed herein.

While executing the computer program code, the processor 520 can read and/or write data to/from memory 522A, storage system 522B, and/or I/O interface 524. The program code executes the processes of the invention. The bus 526 provides a communications link between each of the components in the computing device 514.

The computing device 514 can comprise any general purpose computing article of manufacture capable of executing computer program code installed thereon (e.g., a personal computer, server, etc.). However, it is understood that the computing device 514 is only representative of various possible equivalent-computing devices that may perform the processes described herein. To this extent, in embodiments, the functionality provided by the computing device 514 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 512 is only illustrative of various types of computer infrastructures for implementing the invention. For example, in embodiments, the server 512 comprises two or more computing devices (e.g., a server cluster) that communicate over any type of communications link, such as a network, a shared memory, or the like, to perform the process described herein. Further, while performing the processes described herein, one or more computing devices on the server 512 can communicate with one or more other computing devices external to the server 512 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 15:
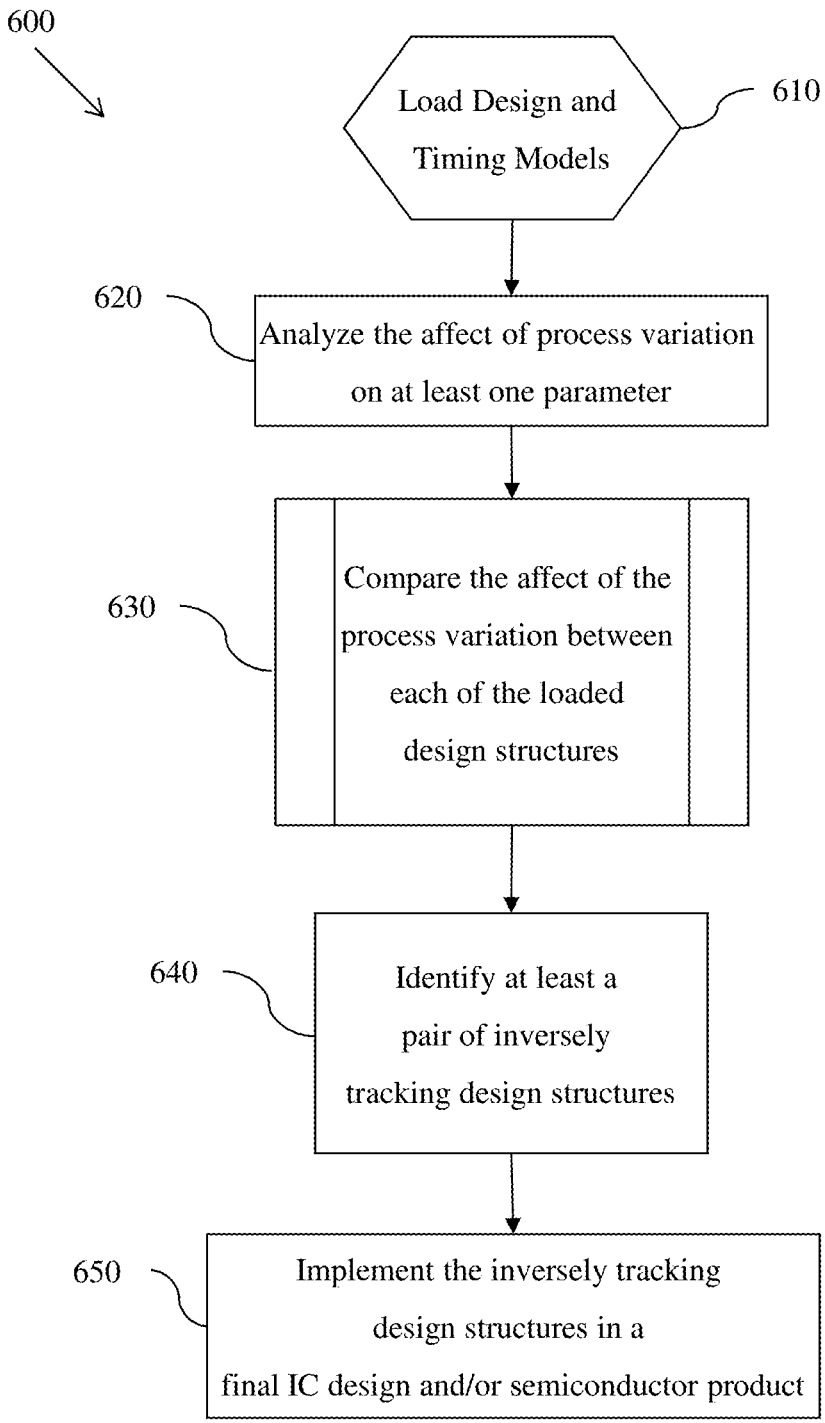
FIG. 15 is an illustrative process flow of implementing the system in accordance with aspects of the invention.

FIG. 15 shows an exemplary flow for performing aspects of the present invention. The steps of FIG. 15 may be implemented in the environment of FIG. 14, for example.

The flowcharts and/or block diagrams in FIG. 15 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 14. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

In embodiments, as shown in FIG. 15, an IC design and/or final semiconductor structure for a desired product may be generated. In accordance with aspects of the invention, the systems and methods of semiconductor design 600 for reducing process sensitivity in the IC design and/or the final semiconductor structure may use simulations including statistical timing to model process variation of IC designs.

At step 610, different design and timing models for a number of IC designs that may be implemented in a desired product device (e.g., a VCO) to achieve a desired result (e.g., a consumer requested frequency range) may be loaded into a computing device. For example, design structures and timing models for a number of FET and capacitor devices (e.g., design structures and timing models for devices 45 and 70 as discussed with respect to FIGS. 3 and 6) may be loaded into assessment tool 550 (as discussed with respect to FIG. 14).

At step 620, an effect of process variation on at least one parameter (e.g., capacitance) for each of the loaded design structures is analyzed at multiple process corners. For example, an effect of the process variation on the at least one parameter for a first integrated circuit design (e.g., the design structure for device 45) may be analyzed at a first process corner, and an effect of the process variation on the at least one parameter for a second integrated circuit design (e.g., the design structure for device 70) may be analyzed at the first process corner. Thereafter or simultaneously, an effect of the process variation on the at least one parameter for the first integrated circuit design (e.g., the design structure for device 45) may be analyzed at a second process corner, and an effect of the process variation on the at least one parameter for the second integrated circuit design (e.g., the design structure for device 70) may be analyzed at the second process corner.

At step 630, the effects of the process variation analyzed for the at least one parameter at the multiple process corners for each design structure is then compared or contrasted with the other design structures (e.g., as shown in FIG. 9). For example, the effect of the process variation on the at least one parameter for the first integrated circuit design (e.g., the design structure for device 45) may be compared to the effect of the process variation on the at least one parameter for the second integrated circuit design (e.g., the design structure for device 70) at the first and second process corners.

At step 640, at least two design structures are identified that demonstrate at least some inverse tracking with respect to the effects of the process variation on the at least one parameter. For example, the first integrated circuit design (e.g., the design structure for device 45) and the second integrated circuit design (e.g., the design structure for device 70) may be identified as an inverse tracking pair of devices when the effect of the process variation on the at least one parameter for the first integrated circuit design tracks opposite to the effect of the process variation on the at least one parameter for the second integrated circuit design. For example, the first integrated circuit design may demonstrate a maximum capacitance at a first process corner and a minimum capacitance at a second process corner, whereas the second integrated circuit design may demonstrate a minimum capacitance at the first process corner and a maximum capacitance at the second process corner.

At step 650, the identified at least two design structures may be implemented in an IC design and/or final semiconductor structure for the desired product such that the process dependency of the at least one parameter may be offset or reduced.

Figure 16:
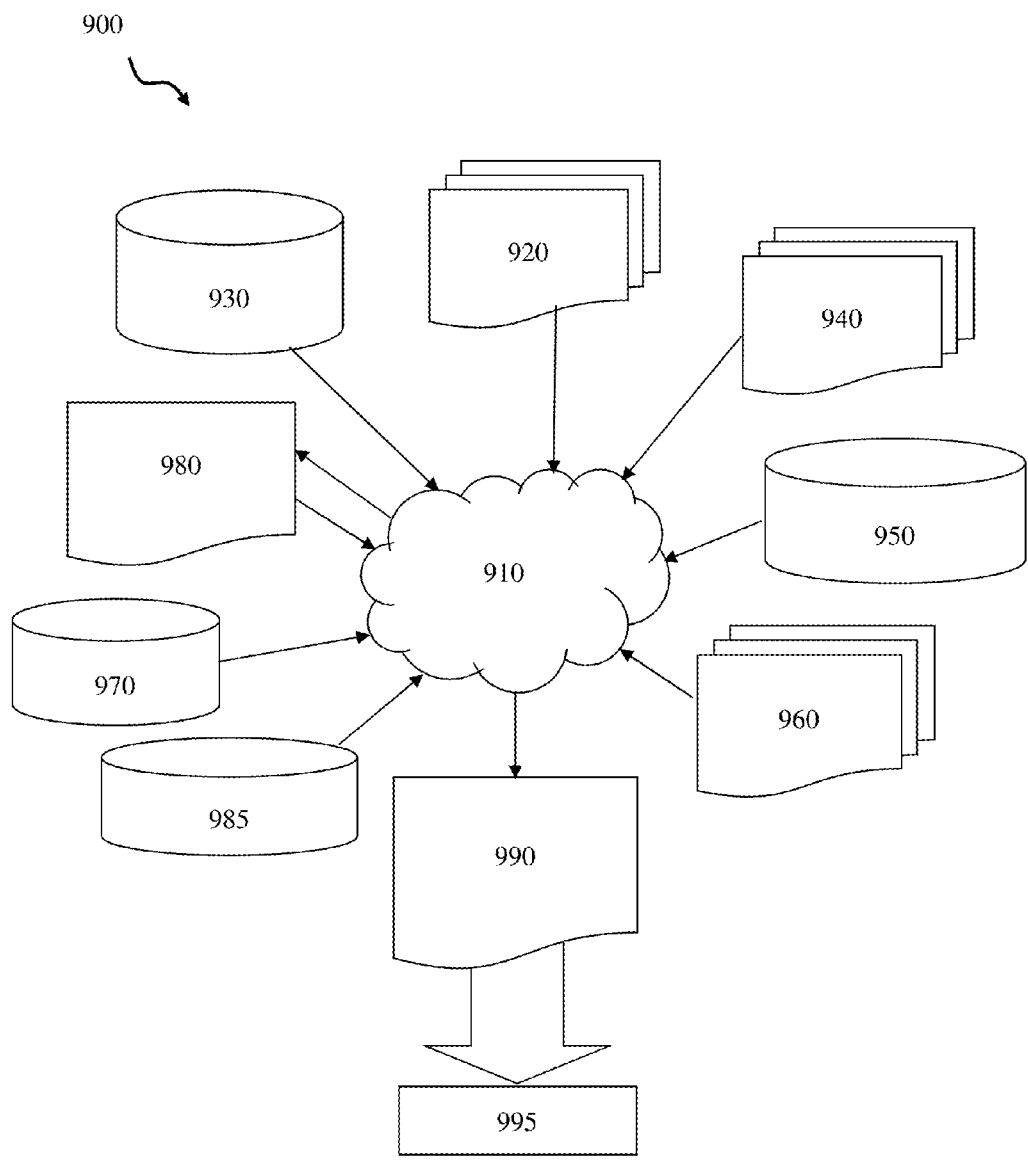
FIG. 16 is a flow diagram of a design process used in semiconductor design, manufacture, and/or test.

FIG. 16 is a flow diagram of a design process used in semiconductor design, manufacture, and/or test used with the system and method of the present invention. FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system, which can be implemented with the method and system of the present invention. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more devices. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An integrated circuit structure comprising:
a first integrated circuit device comprising at least one parameter influenced by process variation in a first manner; and
a second integrated device comprising the least one parameter influenced by the process variation in a second manner,
wherein:
the first manner is opposite of the second manner;
the second integrated device is configured to offset or reduce the influence of the process variation on the at least one parameter in the first integrated circuit device;
the integrated circuit structure is a voltage controlled oscillator (VCO);
the VCO comprises a resonator comprising the first integrated circuit device and the second integrated circuit device; and
the resonator comprises at least one branch of fixed capacitors and at least one branch of finetune capacitors.

2. The integrated circuit structure of claim 1, wherein the at least one branch of fixed capacitors comprises the first integrated circuit device and the second integrated circuit device.

3. The integrated circuit structure of claim 1, wherein:
the at least one branch of fixed capacitors comprises a first branch of capacitors and a second branch of capacitors;
the first branch of capacitors comprises the first integrated circuit device; and
the second branch of capacitors comprises the second integrated circuit device.

4. The integrated circuit structure of claim 1, wherein the at least one branch of fixed capacitors comprises the first integrated circuit device and the at least one branch of finetune capacitors comprises the second integrated circuit device.

5. The integrated circuit structure of claim 1, wherein:
the resonator comprises at least one additional branch of fixed capacitors;
the at least one branch of fixed capacitors comprises the first integrated circuit device and the at least one branch of finetune capacitors comprises the second integrated circuit device; and
the at least one additional branch of fixed capacitors comprises the first integrated circuit device and is configured to always be in a state that is opposite to that of the at least one branch of finetune capacitors.

6. An integrated circuit structure comprising:
a first integrated circuit device comprising at least one parameter influenced by process variation in a first manner; and
a second integrated device comprising the least one parameter influenced by the process variation in a second manner,
wherein:
the first manner is opposite of the second manner;
the second integrated device is configured to offset or reduce the influence of the process variation on the at least one parameter in the first integrated circuit device;
the integrated circuit structure is a voltage controlled oscillator (VCO);
the VCO comprises a resonator comprising the first integrated circuit device and the second integrated circuit device; and
the at least one parameter is capacitance.

7. The integrated circuit structure of claim 6, wherein the capacitance is at a maximum in the first integrated circuit device at a first process corner and the capacitance is at a minimum in the second integrated circuit device at the first process corner.

8. The integrated circuit structure of claim 7, wherein the capacitance is at a minimum in the first integrated circuit device at a second process corner and the capacitance is at a maximum in the second integrated circuit device at the second process corner.

9. An integrated circuit structure comprising an inverse tracking pair of devices configured to perform as capacitors in a voltage controlled oscillator (VCO),
wherein the inverse tracking pair of devices comprises:
a first integrated circuit device comprising at least one parameter influenced by process variation in a first manner; and
a second integrated device comprising the least one parameter influenced by the process variation in a second manner;
wherein the first manner is opposite of the second manner; and
wherein the second irate rated device is configured to offset or reduce the influence of the process variation on the at least one parameter in the first integrated circuit device.

10. The integrated circuit structure of claim 9, wherein the at least one parameter is capacitance.

11. The integrated circuit structure of claim 10, wherein the capacitance is at a maximum in the first integrated circuit device at a first process corner and the capacitance is at a minimum in the second integrated circuit device at the first process corner.

12. The integrated circuit structure of claim 11, wherein the capacitance is at a minimum in the first integrated circuit device at a second process corner and the capacitance is at a maximum in the second integrated circuit device at the second process corner.

13. A method for reducing process sensitivity of at least one parameter in a semiconductor product, the method comprising:
    analyzing an effect of process variation on the at least one parameter for a first integrated circuit design at a first process corner;
    analyzing an effect of the process variation on the at least one parameter for a second integrated circuit design at the first process corner;
    comparing the effect of the process variation on the at least one parameter for the first integrated circuit design to the effect of the process variation on the at least one parameter for the second integrated circuit design;
    determining whether the effect of the process variation on the at least one parameter for the first integrated circuit design tracks opposite to the effect of the process variation on the at least one parameter for the second integrated circuit design;
    identifying the first integrated circuit design and the second integrated circuit design as an inverse tracking pair of devices when the effect of the process variation on the at least one parameter for the first integrated circuit design tracks opposite to the effect of the process variation on the at least one parameter for the second integrated circuit design; and
    implementing the first integrated circuit design and the second integrated circuit design in the semiconductor product such that the process sensitivity for the at least one parameter is reduced or offset,
    wherein the semiconductor product is a voltage controlled oscillator (VCO) and the at least one parameter is capacitance.

14. The method of claim 13, wherein:
    the capacitance is at a maximum in the first integrated circuit design at the first process corner and the capacitance is at a minimum in the second integrated circuit design at the first process corner; and
    the capacitance is at a minimum in the first integrated circuit design at a second process corner and the capacitance is at a maximum in the second integrated circuit design at the second process corner.

* * * * *